(12) United States Patent
Yanagi

(10) Patent No.: US 11,647,618 B2
(45) Date of Patent: May 9, 2023

(54) ELECTROMAGNETIC WAVE SHIELDING FILM AND SHIELDING PRINTED WIRING BOARD

(71) Applicant: Tatsuta Electric Wire & Cable Co., Ltd., Higashiosaka (JP)

(72) Inventor: Yoshiharu Yanagi, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 17/613,711

(22) PCT Filed: May 29, 2020

(86) PCT No.: PCT/JP2020/021383
§ 371 (c)(1),
(2) Date: Nov. 23, 2021

(87) PCT Pub. No.: WO2020/241835
PCT Pub. Date: Dec. 3, 2020

(65) Prior Publication Data
US 2022/0151119 A1 May 12, 2022

(30) Foreign Application Priority Data
May 29, 2019 (JP) .............................. JP2019-100531

(51) Int. Cl.
*H05K 9/00* (2006.01)
*H05K 1/02* (2006.01)

(52) U.S. Cl.
CPC ......... *H05K 9/0084* (2013.01); *H05K 1/0218* (2013.01); *H05K 9/0083* (2013.01); *H05K 9/0088* (2013.01)

(58) Field of Classification Search
CPC .......................... H05K 1/0218; H05K 9/0083
See application file for complete search history.

(56) References Cited

U.S. PATENT DOCUMENTS

| 10,820,457 B1* | 10/2020 | Kishi ................... H05K 1/0227 |
| 2009/0038839 A1* | 2/2009 | Hashimoto .......... H05K 1/0218 156/60 |

(Continued)

FOREIGN PATENT DOCUMENTS

| EP | 3650499 A1 | 5/2020 |
| JP | 2015109404 A | 6/2015 |

(Continued)

OTHER PUBLICATIONS

International Search Report dated Aug. 25, 2020, issued in International Application No. PCT/JP2020/021383.

(Continued)

*Primary Examiner* — Hung V Ngo
(74) *Attorney, Agent, or Firm* — United IP Counselors, LLC; Kenneth M. Fagin

(57) ABSTRACT

The present invention provides an electromagnetic wave shielding film that can be made thinner and that has a higher folding endurance. The electromagnetic wave shielding film of the present invention is an electromagnetic wave shielding film including: a conductive adhesive layer containing conductive particles and an adhesive resin composition, wherein in a cut surface of the conductive adhesive layer after heating and pressurizing the electromagnetic wave shielding film at 150° C. and 2 MPa for 30 minutes, the conductive particles have an average aspect ratio of 18 or more, and an area percentage of the adhesive resin composition is 60 to 95% relative to a total area of the cut surface.

12 Claims, 4 Drawing Sheets

(56) References Cited

U.S. PATENT DOCUMENTS

| | | | | |
|---|---|---|---|---|
| 2014/0326484 A1* | 11/2014 | Tajima | ............... | H05K 9/00 |
| | | | | 174/250 |
| 2016/0120077 A1* | 4/2016 | Watanabe | ............ | H05K 1/0216 |
| | | | | 174/377 |
| 2019/0337262 A1 | 11/2019 | Tsukao et al. | | |
| 2021/0105890 A1* | 4/2021 | Powney | ............... | H05K 1/0218 |
| 2021/0394484 A1 | 12/2021 | Tsukao et al. | | |

FOREIGN PATENT DOCUMENTS

| | | | |
|---|---|---|---|
| JP | 2016115725 A | 6/2016 |
| TW | 201832935 A | 9/2018 |
| TW | 201909724 A | 3/2019 |
| WO | 2020241835 A1 | 12/2020 |

OTHER PUBLICATIONS

Written Opinion dated Aug. 25, 2020, issued in International Application No. PCT/JP2020/021383.

* cited by examiner (a)

(b)

(c)

(a)

(b)

(a)

(b)

ELECTROMAGNETIC WAVE SHIELDING FILM AND SHIELDING PRINTED WIRING BOARD

TECHNICAL FIELD

The present invention relates to an electromagnetic wave shielding film and a shielded printed wiring board.

BACKGROUND ART

Flexible printed wiring boards are widely used to incorporate circuits into complicated mechanisms of mobile devices such as mobile phones and electronic devices such as video cameras and notebook computers, which are rapidly becoming smaller with higher functionality. Owing to their excellent flexibility, flexible printed wiring boards are also used to connect a movable part such as a printer head to a control unit. These electronic devices require electromagnetic wave shielding measures, and flexible printed wiring boards with electromagnetic wave shielding measures (hereinafter also referred to as "shielded printed wiring boards") have been increasingly used in such devices.

In recent years, particularly mobile devices are required to provide multiple functions (such as camera and GPS). In order to provide multiple functions, higher density printed wiring boards have been developed. Since there is a limit in increasing the mobile device size, a method of reducing the thickness of a shielded printed wiring board has been employed to provide a higher density printed wiring board.

The thickness of the shielded printed wiring board may also be reduced by reducing the thickness of an electromagnetic wave shielding film.

However, when a thin electromagnetic wave shielding film is bonded to a stepped printed wiring board by thermocompression, a conductive adhesive layer of the electromagnetic wave shielding film may be stretched at the step, resulting in an increase in electrical resistance or breakage of the electromagnetic wave shielding film.

Patent Literature 1 discloses an electromagnetic wave shielding film (electromagnetic wave shielding sheet) capable of solving such problems. Specifically, the electromagnetic wave shielding sheet includes a conductive layer containing flaky conductive fine particles and a binder resin, and an insulating layer, wherein the flaky conductive fine particles in a cut surface of the conductive layer have an average aspect ratio of 7 to 15, components other than the conductive fine particles account for an area of 55 to 80 relative to a cross-sectional area of the conductive layer before thermocompression bonding which is taken as 100, and a difference in the area accounted for by the components other than the conductive fine particles is 5 to 25 between before and after the thermocompression bonding of the electromagnetic wave shielding sheet at 150° C. and 2 MPa for 30 minutes.

CITATION LIST

Patent Literature

Patent Literature 1: JP 2016-115725 A

SUMMARY OF INVENTION

Technical Problem

The electromagnetic wave shielding film disclosed in Patent Literature 1 is considered to provide both conductivity and conformability when bonded to a stepped printed wiring board by thermocompression.

In recent years, foldable electronic devices have been developed in order to improve the portability and handleability of electronic devices.

In the foldable electronic devices, shielded printed wiring boards are also repeatedly folded.

When the electromagnetic wave shielding sheet of Patent Literature 1 is repeatedly folded, in the conductive layer, the flaky conductive fine particles may be broken or may be separated from each other, resulting in an increase in electrical resistance.

This issue is noticeable particularly when the electromagnetic wave shielding sheet of Patent Literature 1 is made thin so that the conductive layer has a thickness of not more than 7 μm after bonding by thermocompression.

The present invention was made to solve the above problems. The present invention aims to provide an electromagnetic wave shielding film that can be made thinner and that has a higher folding endurance.

Solution to Problem

The electromagnetic wave shielding film of the present invention is an electromagnetic wave shielding film including: a conductive adhesive layer containing conductive particles and an adhesive resin composition, wherein in a cut surface of the conductive adhesive layer (i.e., as seen in cross-section) after heating and pressurizing the electromagnetic wave shielding film at 150° C. and 2 MPa for 30 minutes, the conductive particles have an average aspect ratio of 18 or more, and an area percentage of the adhesive resin composition is 60 to 95% relative to a total area of the cut surface.

In the electromagnetic wave shielding film of the present invention, in a cut surface of the conductive adhesive layer after heating and pressurizing the electromagnetic wave shielding film at 150° C. and 2 MPa for 30 minutes, the conductive particles have an average aspect ratio of 18 or more.

The conductive particles having an average aspect ratio of 18 or more have sufficient flexibility. Thus, the conductive particles can be folded conforming to the electromagnetic wave shielding film when it is repeatedly folded. Thus, the conductive particles are less likely to be displaced and are not easily breakable.

As a result, the contact between the conductive particles can be sufficiently maintained, which can prevent an increase in electrical resistance.

Conductive particles having an average aspect ratio of less than 18 have poor flexibility. When the electromagnetic wave shielding film is repeatedly folded, such conductive particles are easily displaced and easily breakable. As a result, the electrical resistance tends to increase.

Herein, the average aspect ratio of the conductive particles in a cut surface of the conductive adhesive layer refers to the average aspect ratio of the conductive particles determined from a cross-sectional SEM image of the electromagnetic wave shielding film. Specifically, image data taken with a magnification of 3000 by a scanning electron microscope (JSM-6510LA available from JEOL Ltd.) are processed using image processing software (SEM Control User Interface Ver 3.10) to measure the length and thickness of 100 conductive particles per image and calculate the ratio of the length divided by the thickness for each conductive particle. The resulting values excluding the top and bottom 15 percent are averaged to determine the aspect ratio.

In the electromagnetic wave shielding film of the present invention, in a cut surface of the conductive adhesive layer after heating and pressurizing the electromagnetic wave shielding film at 150° C. and 2 MPa for 30 minutes, the area percentage of the adhesive resin composition is 60 to 95% relative to the total area of the cut surface.

When the area percentage is less than 60%, the percentage of the conductive particles is relatively high, so that the conductive particles become dense, leading to poor flexibility of the conductive adhesive layer. This results in poor conformability.

When the area percentage is more than 95%, there are less contact points between the conductive particles, resulting in a low conductivity.

Herein, the area percentage of the adhesive resin composition relative to the total area of the cut surface refers to the area percentage of the adhesive resin composition determined from a cross-sectional SEM image of the electromagnetic wave shielding film.

A specific calculation method is as follows.

A cut surface of the conductive adhesive layer is observed using a scanning electron microscope (SEM).

SEM observation of the cut surface in the direction perpendicular to the cur surface shows a contrast difference between the adhesive resin composition and each conductive particle, making it possible to recognize the shape of the conductive particle.

A cross-sectional SEM image of the electromagnetic wave shielding film is binarized into black (adhesive resin composition) and white (conductive particles) using image analysis software "GIMP2.10.6".

Subsequently, black pixels and white pixels are counted, and the area percentage of the adhesive resin composition is calculated from the percentage of the pixels.

The electromagnetic wave shielding film of the present invention may further include an insulating layer.

Owing to the insulating layer, the electromagnetic wave shielding has better handleability. The insulating layer can also insulate the conductive adhesive layer from the outside.

The electromagnetic wave shielding film of the present invention may include a metal film between the insulating layer and the conductive adhesive layer.

Owing to the metal film, the electromagnetic wave shielding film has a better electromagnetic wave shielding effect and a higher folding endurance.

In the electromagnetic wave shielding film of the present invention, in a cut surface of the conductive adhesive layer after heating and pressurizing the electromagnetic wave shielding film at 150° C. and 2 MPa for 30 minutes, preferably, the conductive particles have an average length of 5.0 to 50.0 μm.

When the average length of the conductive particles is in this range, the conductive particles each have a suitable size and strength.

This improves the conductivity and folding endurance of the conductive adhesive layer. Thus, the conductive adhesive layer can be made even thinner.

In other words, it is possible to make the conductive adhesive layer thinner while the conductivity and folding endurance of the conductive adhesive layer are maintained.

Herein, the length of the conductive particles refers to the value determined from a cross-sectional SEM image of the electromagnetic wave shielding film, using image processing software (SEM Control User Interface Ver 3.10).

In the electromagnetic wave shielding film of the present invention, preferably, the weight percentage of the conductive particles is 60 to 80 wt % relative to the total weight of the conductive particles and the adhesive resin composition.

When the weight percentage of the conductive particles is less than 60 wt %, there are less contact points between the conductive particles, resulting in a low conductivity.

When the weight percentage of the conductive particles is more than 80 wt %, the conductive adhesive layer has poor flexibility and is easily breakable. In addition, since the amount of adhesive resin composition is relatively small, the conductive adhesive layer has a low peeling strength.

The shielded printed wiring board of the present invention includes a printed wiring board including a base film, a printed circuit on the base film, and a coverlay covering the printed circuit; and an electromagnetic wave shielding film including a conductive adhesive layer containing conductive particles and an adhesive resin composition, the electromagnetic wave shielding film being arranged on the printed wiring board such that the conductive adhesive layer is in contact with the coverlay, wherein in a cut surface of the conductive adhesive layer, the conductive particles have an average aspect ratio of 18 or more, and in the cut surface of the conductive adhesive layer, an area percentage of the adhesive resin composition is 60 to 95% relative to a total area of the cut surface.

In the shielded printed wiring board of the present invention, in a cut surface of the conductive adhesive layer, the conductive particles have an average aspect ratio of 18 or more.

The conductive particles having an average aspect ratio of 18 or more have sufficient flexibility. Thus, the conductive particles can be folded conforming to the shielded printed wiring board when it is repeatedly folded. Thus, the conductive particles are less likely to be displaced and are not easily breakable.

As a result, the contact between the conductive particles can be sufficiently maintained, which can prevent an increase in electrical resistance.

Conductive particles having an average aspect ratio of less than 18 have poor flexibility. When the shielded printed wiring board is repeatedly folded, such conductive particles are easily displaced and easily breakable. As a result, the electrical resistance tends to increase.

In the shielded printed wiring board of the present invention, in a cut surface of the conductive adhesive layer, the area percentage of the adhesive resin composition is 60 to 95% relative to the total area of the cut surface.

When the area percentage is less than 60%, the percentage of the conductive particles is relatively high, so that the conductive particles become dense, leading to poor flexibility of the conductive adhesive layer. This results in a low folding endurance. In addition, when the printed wiring board in contact with the electromagnetic wave shielding film has a step, the conductive adhesive layer cannot conform to the step, and a gap is thus easily generated.

When the area percentage is more than 95%, there are less contact points between the conductive particles, resulting in a low conductivity.

In the shielded printed wiring board of the present invention, the printed circuit includes a ground circuit, and the coverlay has an opening formed therein for exposing the ground circuit. The conductive adhesive layer may fill the opening and be in contact with the ground circuit.

With such a configuration, the conductive adhesive layer is electrically connected to the ground circuit. This results in a good grounding effect.

In addition, since the conductive adhesive layer is configured as described above, even when the conductive adhesive layer has such an opening, the conductive adhesive layer can conform to the shape of the opening and fill the opening. Thus, a gap is not easily generated in the opening.

The shielded printed wiring board of the present invention may further include an insulating layer adjacent to a side of the conductive adhesive layer, the side being not in contact with the coverlay.

Such an insulating layer can insulate the conductive adhesive layer from the outside.

Preferably, the shielded printed wiring board of the present invention further includes a metal film between the conductive adhesive layer and the insulating layer.

The metal film arranged as described above improves the electromagnetic wave shielding effect and folding endurance.

In the shielded printed wiring board of the present invention, preferably, the average length of the conductive particles is 5.0 to 50.0 μm.

When the average length of the conductive particles is in this range, the conductive particles each have a suitable size and strength.

This improves the conductivity and folding endurance of the conductive adhesive layer. Thus, the conductive adhesive layer can be made even thinner.

In other words, it is possible to make the conductive adhesive layer thinner while the conductivity and folding endurance of the conductive adhesive layer are maintained.

In the shielded printed wiring board of the present invention, preferably, the thickness of the conductive adhesive layer is 2 to 7 μm.

As described above, the conductive adhesive layer of the shielded printed wiring board of the present invention has a higher folding endurance. Thus, the conductive adhesive layer is not easily breakable and is less likely to have a low conductivity even when it is as thin as 2 to 7 μm.

In the shielded printed wiring board of the present invention, preferably, the weight percentage of the conductive particles is 60 to 80 wt % relative to the total weight of the conductive particles and the adhesive resin composition.

When the weight percentage of the conductive particles is less than 60 wt %, there are less contact points between the conductive particles, resulting in a low conductivity.

When the weight percentage of the conductive particles is more than 80 wt %, the conductive adhesive layer has poor flexibility and is easily breakable. In addition, since the amount of adhesive resin composition is relatively small, the conductive adhesive layer has a low peeling strength.

Advantageous Effects of Invention

In the electromagnetic wave shielding film of the present invention, the shape of each conductive particle has the predetermined aspect ratio described above, and the adhesive resin composition is adjusted to have the predetermined parameters described above.

Thus, the electromagnetic wave shielding film can be made thinner, and it is possible to prevent an increase in electrical resistance and improve the folding endurance.

DESCRIPTION OF EMBODIMENTS

The following specifically describes the electromagnetic wave shielding film and the shielded printed wiring board of the present invention. The present invention is not limited to the following embodiments, and variations can be made without departing from the spirit of the present invention.

First Embodiment

Figure 1:
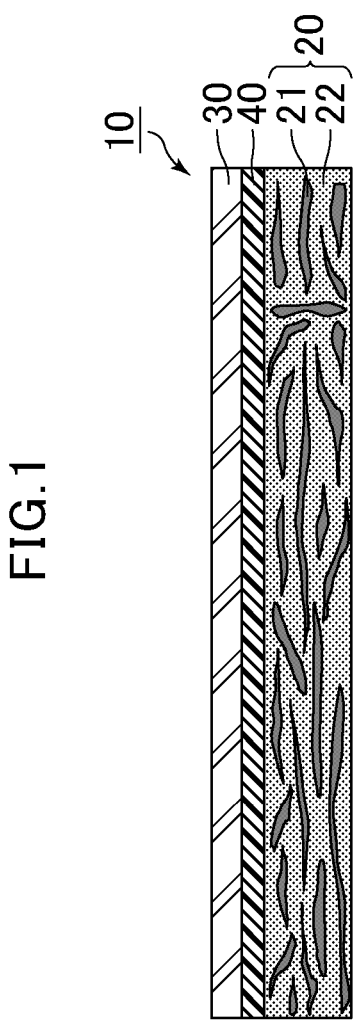
FIG. 1 is a schematic cross-sectional view of an exemplary electromagnetic wave shielding film according to a first embodiment of the present invention.

FIG. 1 is a schematic cross-sectional view of an exemplary electromagnetic wave shielding film according to a first embodiment of the present invention.

As shown in FIG. 1, an electromagnetic wave shielding film 10 includes a conductive adhesive layer 20 containing conductive particles 21 and an adhesive resin composition 22; an insulating layer 30 stacked above the conductive adhesive layer 20, and a metal film 40 between the conductive adhesive layer 20 and the insulating layer 30.

Owing to the insulating layer 30, the electromagnetic wave shielding film 10 has better handleability. The insulating layer 30 can also insulate the conductive adhesive layer 20 from the outside.

Owing to the metal film 40, the electromagnetic wave shielding film 10 has a better electromagnetic wave shielding effect and a higher folding endurance.

In the electromagnetic wave shielding film 10, in a cut surface of the conductive adhesive layer 20 i.e., as seen in cross-section, the cut surface being a surface that would be seen if the layer were hypothetically cut from top to bottom after heating and pressurizing the electromagnetic wave shielding film 10 at 150° C. and 2 MPa for 30 minutes, the conductive particles 21 have an average aspect ratio of 18 or more. Preferably, the average aspect ratio is 18 to 150.

The conductive particles 21 having an average aspect ratio of 18 or more have sufficient flexibility. Thus, the conductive particles 21 can be folded conforming to the electromagnetic wave shielding film 10 when it is repeatedly folded. Thus, the conductive particles 21 are less likely to be displaced and are not easily breakable. As a result, the contact between the conductive particles 21 can be sufficiently maintained, which can prevent an increase in electrical resistance.

In particular, it is possible to prevent an increase in connection resistance (i.e., electrical resistance in response to energization, via the conductive adhesive layer, of electrodes connected to a first main surface and a second main surface of the conductive adhesive layer) of the conductive adhesive layer 20 of the electromagnetic wave shielding film 10 in the thickness direction.

Conductive particles having an average aspect ratio of less than 18 have poor flexibility. When the electromagnetic wave shielding film is repeatedly folded, such conductive particles are easily displaced and easily breakable. As a result, the electrical resistance tends to increase.

The conductive particles 21 having an average aspect ratio of more than 150 have a larger contact area therebetween in the planar direction but a smaller contact area therebetween in the thickness direction of the conductive adhesive layer, so that the electrical resistance tends to increase.

In a cut surface of the conductive adhesive layer 20 after heating and pressurizing the electromagnetic wave shielding film 10 at 150° C. and 2 MPa for 30 minutes, the area percentage of the adhesive resin composition 22 is 60 to 95% relative to the total area of the cut surface.

When the area percentage is in the range of 60 to 95%, the balance between the amount of the conductive particles 21 and the amount of the adhesive resin composition 22 is good, resulting in a higher folding endurance and a higher conductivity.

When the area percentage is less than 60%, the percentage of the conductive particles is relatively high, so that the conductive particles become dense, leading to poor flexibility of the conductive adhesive layer. This results in poor conformability.

When the area percentage is more than 95%, there are less contact points between the conductive particles, resulting in a low conductivity.

The following describes each component of the electromagnetic wave shielding film 10 in detail.

(Conductive Adhesive Layer)

The thickness of the conductive adhesive layer 20 is not limited, but preferably, it is 2 to 7 μm after heating and pressurizing the electromagnetic wave shielding film 10 at 150° C. and 2 MPa for 30 minutes.

As described above, the conductive adhesive layer 20 has a higher folding endurance. Thus, the conductive adhesive layer 20 is not easily breakable and is less likely to have a low conductivity even when it is as thin as 2 to 7 μm after heating and pressurizing.

As described above, the conductive adhesive layer 20 contains the conductive particles 21 and the adhesive resin composition 22.

The conductive adhesive layer 20 may contain additives such as flame retardants, flame retardant aids, curing accelerators, tackifiers, antioxidants, pigments, dyes, plasticizers, UV absorbers, defoamers, leveling agents, fillers, and viscosity modifiers, as needed.

(Conductive Particles)

Preferably, the conductive particles 21 are made of a metal such as silver, copper, nickel, aluminum, and silver-coated copper (silver-plated copper).

These metals are easy to mold and have flexibility.

The conductive particles 21 may have any shape as long as the average aspect ratio thereof is 18 or more after heating and pressurizing the electromagnetic wave shielding film 10 at 150° C. and 2 MPa for 30 minutes. Each conductive particle may have a flaky, dendritic, rod, or fibrous shape, for example, preferably, a flaky shape with which the electromagnetic wave shielding film can be made thinner.

In a cut surface of the conductive adhesive layer 20 after heating and pressurizing the electromagnetic wave shielding film 10 at 150° C. and 2 MPa for 30 minutes, the average length of the conductive particles 21 is preferably 5.0 to 50.0 μm, more preferably 5.0 to 30.0 μm, still more preferably 5.0 to 20.0 μm, particularly preferably 5.0 to 8.0 μm.

When the average length of the conductive particles is in this range, the conductive particles each have a suitable size and strength.

This improves the conductivity and folding endurance of the conductive adhesive layer 20. Thus, the conductive adhesive layer 20 can be made even thinner.

In other words, it is possible to make the conductive adhesive layer 20 thinner while the conductivity and folding endurance of the conductive adhesive layer 20 are maintained.

In the electromagnetic wave shielding film 10, preferably, the weight percentage of the conductive particles 21 is 60 to 80 wt % relative to the total weight of the conductive particles 21 and the adhesive resin composition 22.

When the weight percentage of the conductive particles is less than 60 wt %, there are less contact points between the conductive particles, resulting in a low conductivity.

When the weight percentage of the conductive particles is more than 80 wt %, the conductive adhesive layer has poor flexibility and is easily breakable. In addition, since the amount of adhesive resin composition is relatively small, the conductive adhesive layer has a low peeling strength.

(Adhesive Resin Composition)

The adhesive resin composition 22 may be made of any material. Examples include thermoplastic resin compositions such as styrene resin compositions, vinyl acetate resin compositions, polyester resin compositions, polyethylene resin compositions, polypropylene resin compositions, imide resin compositions, amide resin compositions, and acrylic resin compositions; and thermosetting resin compositions such as phenolic resin compositions, epoxy resin compositions, urethane resin compositions, melamine resin compositions, and alkyd resin compositions.

The adhesive resin composition may be made of one of these materials or a combination of two or more of these materials.

In a cut surface of the conductive adhesive layer 20, preferably, the conductive particles 21 are oriented in the longitudinal direction of the conductive adhesive layer 20.

In a cut surface of the conductive adhesive layer 20, the average angle of the conductive adhesive layer 20 in the longitudinal direction relative to the longitudinal direction of the conductive particles 21 is preferably 0 to 14°, more preferably 0 to 10°, still more preferably 0 to 9°.

A specific average angle calculation method is as follows.

A conductive adhesive layer-side surface of the electromagnetic wave shielding film is bonded to a 30 μm thick polyimide film having a smooth surface by heating and pressurizing at 150° C. and 2 MPa for 30 minutes. Then, a cut surface of the electromagnetic wave shielding film is observed using a scanning electron microscope (SEM).

SEM observation of the cut surface in the direction perpendicular to the cur surface shows a flat interface between the conductive adhesive layer and the polyimide film and a contrast difference between the adhesive resin composition and the conductive particle, making it possible to recognize the shapes of the conductive particles.

Then, a cross-sectional SEM image of the electromagnetic wave shielding film is binarized into black (adhesive resin composition) and white (conductive particles) using image analysis software "GIMP2.10.6".

Then, a line segment connecting both ends of a conductive particle in the longitudinal direction is drawn to measure the angle formed by the line segment relative to an interface between the conductive adhesive layer and the polyimide film. Such angles are averaged by calculation.

The conductive particles 21 being oriented as described above can be easily folded when the electromagnetic wave shielding film 10 is folded.

This improves the folding endurance of the electromagnetic wave shielding film.

(Insulating Film)

The insulating layer 30 of the electromagnetic wave shielding film 10 is not limited as long as it has sufficient insulation and it can protect the conductive adhesive layer 20 and the metal film 40. Yet, preferably, it is made of a thermoplastic resin composition, a thermosetting resin composition, an active energy ray-curable composition, or the like, for example.

Non-limiting examples of the thermoplastic resin composition include styrene resin compositions, vinyl acetate resin compositions, polyester resin compositions, polyethylene resin compositions, polypropylene resin compositions, imide resin compositions, and acrylic resin compositions.

Non-limiting examples of the thermosetting resin composition include phenolic resin compositions, epoxy resin compositions, urethane resin compositions, melamine resin compositions, and alkyd resin compositions.

Non-limiting examples of the active energy ray-curable composition include a polymerizable compound having at least two (meth)acryloyloxy groups in the molecule.

The insulating layer 30 may be made of one single material or two or more materials.

The insulating layer 30 may contain additives such as curing accelerators, tackifiers, antioxidants, pigments, dyes, plasticizers, ultraviolet light absorbers, defoamers, leveling agents, fillers, flame retardants, viscosity modifiers, and anti-blocking agents, as needed.

The thickness of the insulating layer 30 is not limited and can be suitably set as needed, but it is preferably 1 to 15 µm, more preferably 3 to 10 µm.

(Metal Film)

The metal film 40 may include a layer made of a material such as gold, silver, copper, aluminum, nickel, tin, palladium, chromium, titanium, or zinc, and preferably includes a copper layer.

Copper is a material suitable for the metal film 40 in terms of conductivity and economic efficiency.

The metal film 40 may include a layer made of an alloy of the above metals.

Preferably, the thickness of the metal film 40 is 0.01 to 10 µm.

A metal film having a thickness of less than 0.01 µm is less likely to provide a sufficient shielding effect.

A metal film having a thickness of more than 10 µm is difficult to fold.

The electromagnetic wave shielding film 10 may include an anchor coat layer between the insulating layer 30 and the metal film 40.

Examples of the material of the anchor coat layer include urethane resins, acrylic resins, core-shell composite resins containing a urethane resin as the shell and an acrylic resin as the core, epoxy resins, imide resins, amide resins, melamine resins, phenolic resins, urea formaldehyde resins, blocked isocyanates obtained by reacting polyisocyanate with a blocking agent such as phenol, polyvinyl alcohol, and polyvinylpyrrolidone.

The following describes a method of producing a shielded printed wiring board including the electromagnetic wave shielding film according to the first embodiment of the present invention.

Figure 2:
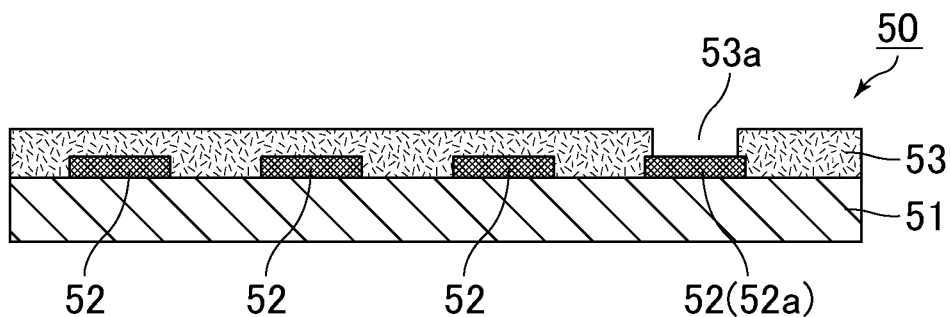
FIGS. 2(a) to 2(c) are views showing steps of a method of producing a shielded printed wiring board including the electromagnetic wave shielding film according to the first embodiment of the present invention.
Figure 2:
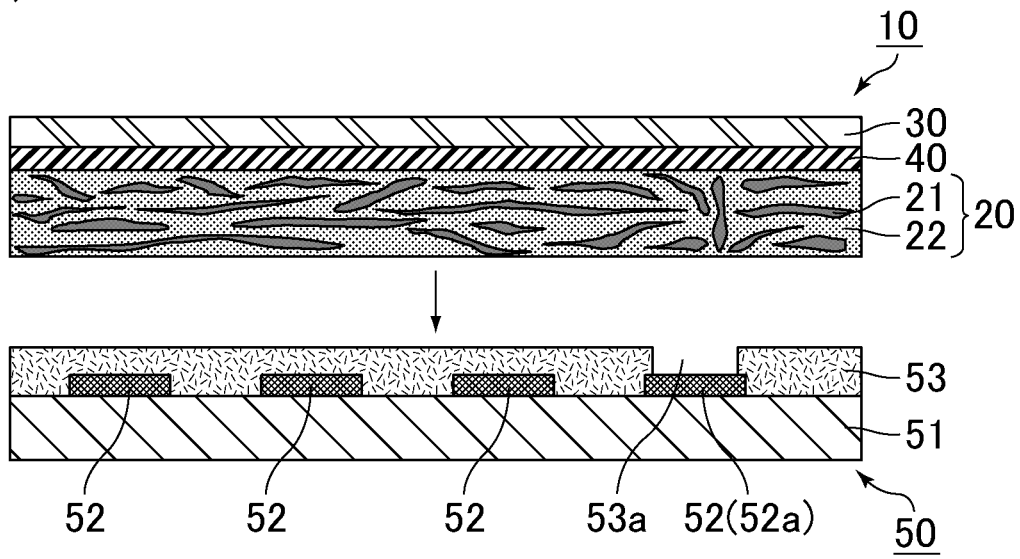
Figure 2:
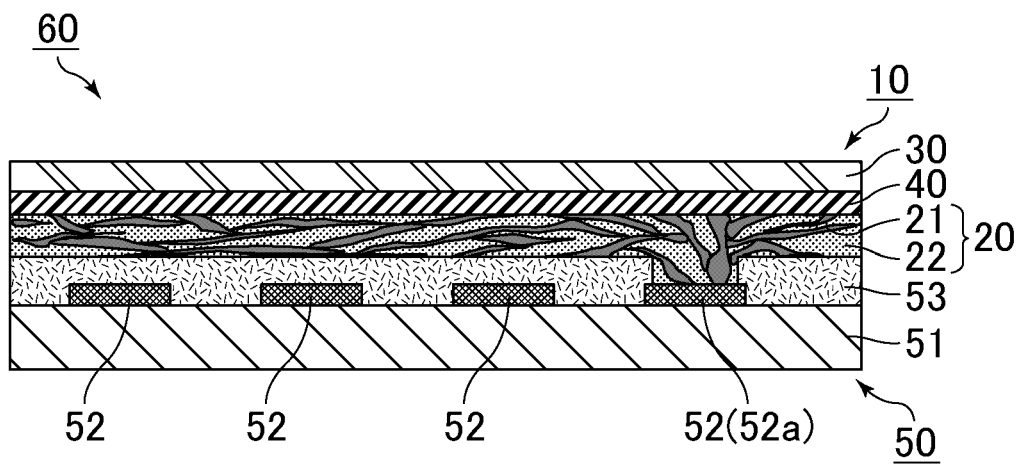

FIGS. 2(a) to 2(c) are views showing steps of the method of producing a shielded printed wiring board including the electromagnetic wave shielding film according to the first embodiment of the present invention.

(1) Preparing of Printed Wiring Board

First, as shown in FIG. 2(a), a printed wiring board 50 including a base film 51, a printed circuit 52 on the base film 51, and a coverlay 53 covering the printed circuit 52 is provided.

In the printed wiring board 50, the printed circuit 52 includes a ground circuit 52a, and the coverlay 53 has an opening 53a formed therein for exposing the ground circuit 52a.

The base film 51 and the coverlay 53 may be made of any material, preferably an engineering plastic. Examples of the engineering plastic include polyethylene terephthalate, polypropylene, cross-linked polyethylen, polyester, polybenzimidazole, polyimide, polyimideamide, polyetherimide, polyphenylene sulfide, and like other resins.

Of these engineering plastics, a polyphenylene sulfide film is preferred when flame retardancy is required, while a polyimide film is preferred when heat resistance is required.

Preferably, the thickness of the base film 51 is 10 to 40 µm. Preferably, the thickness of the coverlay 53 is 10 to 30 µm.

The printed circuit 52 can be formed by any method, such as etching of a conductive material.

Examples of the conductive material include copper, nickel, silver, and gold.

(2) Bonding of Electromagnetic Wave Shielding Film

Next, as shown in FIG. 2(b), the electromagnetic wave shielding film 10 is provided and arranged on the printed wiring board 50 such that the conductive adhesive layer 20 is in contact with the coverlay 53.

(3) Heating and Pressurizing

Next, heating and pressurizing are performed to bond the electromagnetic wave shielding film 10 to the printed wiring board 50.

Preferably, heating and pressurizing conditions are 150° C. to 200° C. and 2 to 5 MPa for 1 to 10 minutes.

The opening 53a is filled with the conductive adhesive layer 20 by the heating and pressurizing.

A shielded printed wiring board 60 as shown in FIG. 2(c) can be produced by the above steps.

The shielded printed wiring board 60 is also an exemplary shielded printed wiring board of the present invention.

In a cut surface of the conductive adhesive layer 20 of the shielded printed wiring board 60, the conductive particles 21 have an average aspect ratio of 18 or more. Preferably, the average aspect ratio is 18 to 150.

The conductive particles 21 having an average aspect ratio of 18 or more have sufficient flexibility. Thus, the conductive particles 21 can be folded conforming to the shielded printed wiring board 60 when it is repeatedly folded. Thus, the conductive particles 21 are less likely to be displaced and are not easily breakable. As a result, the contact between the conductive particles 21 can be sufficiently maintained, which can prevent an increase in electrical resistance.

Conductive particles having an average aspect ratio of less than 18 have poor flexibility. When the shielded printed wiring board is repeatedly folded, such conductive particles are easily displaced and easily breakable. As a result, the electrical resistance tends to increase.

The conductive particles 21 having an average aspect ratio of more than 150 have a larger contact area therebetween in the planar direction but has a smaller contact area therebetween in the thickness direction of the conductive adhesive layer, so that the electrical resistance tends to increase.

In a cut surface of the conductive adhesive layer 20 of the shielded printed wiring board 60, the area percentage of the adhesive resin composition 22 is 60 to 95% relative to the total area of the cut surface.

When the area percentage is in the range of 60 to 95%, the balance between the amount of the conductive particles 21 and the amount of the adhesive resin composition 22 is good, resulting in a higher folding endurance and a higher conductivity.

When the area percentage is less than 60%, the percentage of the conductive particles is relatively high, so that the conductive particles become dense, leading to poor flexibility of the conductive adhesive layer. This results in a low folding endurance. In addition, when the printed wiring board in contact with the electromagnetic wave shielding film has a step, the conductive adhesive layer cannot conform to the step, and a gap is thus easily generated.

When the area percentage is more than 95%, there are less contact points between the conductive particles, resulting in a low conductivity.

In the shielded printed wiring board 60, preferably, the thickness of the conductive adhesive layer 20 is 2 to 7 μm.

As described above, the conductive adhesive layer 20 of the shielded printed wiring board 60 has a higher folding endurance. Thus, the conductive adhesive layer 20 is not easily breakable and is less likely to have a low conductivity even when it is as thin as 2 to 7 μm.

Second Embodiment

The following describes an electromagnetic wave shielding film according to a second embodiment of the present invention.

Figure 3:
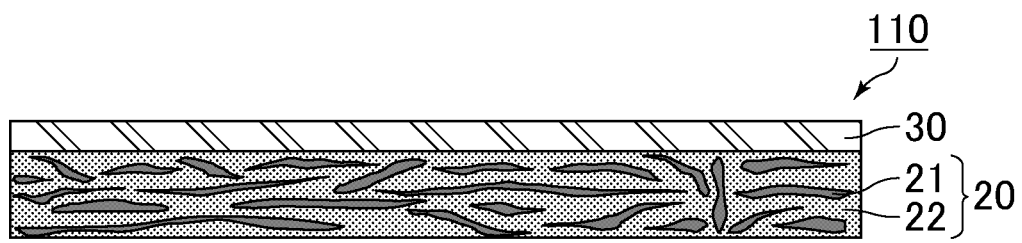
FIG. 3 is a schematic cross-sectional view of an exemplary electromagnetic wave shielding film according to a second embodiment of the present invention.

FIG. 3 is a schematic cross-sectional view of an exemplary electromagnetic wave shielding film according to the second embodiment of the present invention.

An electromagnetic wave shielding film 110 shown in FIG. 3 has the same configuration as the electromagnetic wave shielding film 10 according to the first embodiment of the present invention, except that the metal film 40 is not included.

In other words, the electromagnetic wave shielding film 110 includes the conductive adhesive layer 20 containing the conductive particles 21 and the adhesive resin composition 22; and the insulating layer 30 stacked on the conductive adhesive layer 20.

In the electromagnetic wave shielding film 110, in a cut surface of the conductive adhesive layer 20 after heating and pressurizing the electromagnetic wave shielding film 110 at 150° C. and 2 MPa for 30 minutes, the conductive particles 21 have an average aspect ratio of 18 or more.

In a cut surface of the conductive adhesive layer 20 after heating and pressurizing the electromagnetic wave shielding film 110 at 150° C. and 2 MPa for 30 minutes, the area percentage of the adhesive resin composition 22 is 60 to 95% relative to the total area of the cut surface.

Preferred configurations of the conductive adhesive layer 20, the conductive particles 21, the adhesive resin composition 22, and the insulating layer 30 of the electromagnetic wave shielding film 110 are the same as those of the conductive adhesive layer 20, the conductive particles 21, the adhesive resin composition 22, and the insulating layer 30 of the electromagnetic wave shielding film 10 according to the first embodiment of the present invention.

Even with such a configuration, the electromagnetic wave shielding film 110 can sufficiently shield electromagnetic waves and has a sufficient folding endurance.

EXAMPLES

Examples that more specifically describe the present invention are provided below, but the present invention is not limited to these examples.

Example 1

A transfer film was coated with an epoxy resin and heated by an electric oven at 100° C. for two minutes, whereby a 5 μm thick insulating layer was produced.

Then, an adhesive resin composition (cresol novolac epoxy resin: Epiclon N-655-EXP available from DIC) and silver-coated copper powder (as conductive particles) described in Table 1 were provided, and they were mixed such that the weight percentage of the conductive particles was 65 wt % relative to the total weight of the conductive particles and the adhesive resin composition, whereby a conductive resin composition was produced.

Table 1 shows physical properties of the conductive particles used.

Next, the conductive resin composition was applied to the insulating layer to form a 7 μm thick conductive adhesive layer, whereby an electromagnetic wave shielding film according to Example 1 was produced.

Examples 2 and 3 and Comparative Examples 1 to 3

Electromagnetic wave shielding films according to Examples 2 and 3 and Comparative Examples 1 to 3 were produced as in Example 1, except that the silver-coated copper powder was added in the amounts shown in Table 1. Table 1 shows physical properties of the conductive particles.

TABLE 1

| | | Ex 1 | Ex 2 | Ex 3 | Comp Ex 1 | Comp Ex 2 | Comp Ex 3 |
|---|---|---|---|---|---|---|---|
| Physical properties of conductive particles | Shape | Flaky | Flaky | Flaky | Flaky | Flaky | Flaky |
| | Specific surface area (m$^2$/g) | 0.97 | 1.00 | 1.13 | 0.46 | 0.34 | 1.70 |
| | Tap density (g/cm$^2$) | 1.40 | 1.30 | 1.20 | 3.30 | 5.60 | 0.60 |
| | Average length (μm) | 5.41 | 7.55 | 11.33 | 2.52 | 3.55 | 5.51 |
| | Aspect ratio of conductive particles | 22.8 | 26.5 | 33.5 | 7.9 | 2.9 | 48.5 |
| Weight percentage (wt %) of conductive particles | | 65 | 65 | 65 | 65 | 65 | 65 |
| Area percentage (%) of adhesive resin composition in cut surface of electromagnetic wave shielding film before heating and pressurizing | | 80.2 | 81.1 | 86.5 | 78.4 | 85.9 | 68.1 |
| Area percentage (%) of adhesive resin composition in cut surface of electromagnetic wave shielding film after heating and pressurizing | | 75.6 | 78 | 86.4 | 70.8 | 73.4 | 59.2 |
| Peeling strength after heating and pressurizing | | 5.2 | 4.2 | 3.3 | 8.3 | 8.9 | 2.2 |
| Thickness (μm) of conductive adhesive layer after heating and pressurizing | | 5 | 5 | 5 | 6 | 6 | 5 |

TABLE 1-continued

|  |  | Ex 1 | Ex 2 | Ex 3 | Comp Ex 1 | Comp Ex 2 | Comp Ex 3 |
|---|---|---|---|---|---|---|---|
| Degree of orientation (°) of conductive particles | | 7.3 | 8.6 | 8.1 | 4.6 | 5.3 | 15.0 |
| Folding endurance | | ⊚ | ⊚ | ○ | X | X | X |
| Connection resistance measurement test | Initial electrical resistance (Ω) | 89 | 61 | 32 | 390 | OL | 18 |
| | Electrical resistance after hot air reflow (Ω) | 114 | 74 | 37 | 519 | OL | 19 |

* OL means that the resistance exceeds 3.5 MΩ.

(Heating and Pressurizing Test)

First, 25 μm thick polyimide resin plates were provided. Then, the electromagnetic wave shielding films according to the examples and the comparative examples were arranged on the respective polyimide resin plates such that each conductive adhesive layer was in contact with the corresponding polyimide resin plate.

Next, the electromagnetic wave shielding films according to the examples and the comparative examples were attached to the respective polyimide resin plates by heating and pressurizing at 150° C. and 2 MPa for 30 minutes.

Table 1 shows the thickness of the conductive adhesive layer of each electromagnetic wave shielding film after heating and pressurizing.

Each electromagnetic wave shielding film after heating and pressurizing test was cut, and an SEM image was taken and processed using image processing software (SEM Control User Interface Ver 3.10) to measure the length and the aspect ratio of the conductive particles. Table 1 shows the results.

In addition, each electromagnetic wave shielding film was cut before and after the heating and pressurizing test, and SEM images were taken and processed using image analysis software "GIMP2.10.6" to calculate, in each cut surface of the conductive adhesive layer, the area percentage of the adhesive resin composition relative to the total area of the cut surface, and the degree of orientation of the conductive particles (the average angle of the conductive adhesive layer in the longitudinal direction relative to the longitudinal direction of the conductive particles). Table 1 shows the results.

A cross-sectional SEM image of the electromagnetic wave shielding film according to Example 1 and a cross-sectional SEM image of the electromagnetic wave shielding film according to Comparative Example 1 are shown as representative examples.

Figure 4:
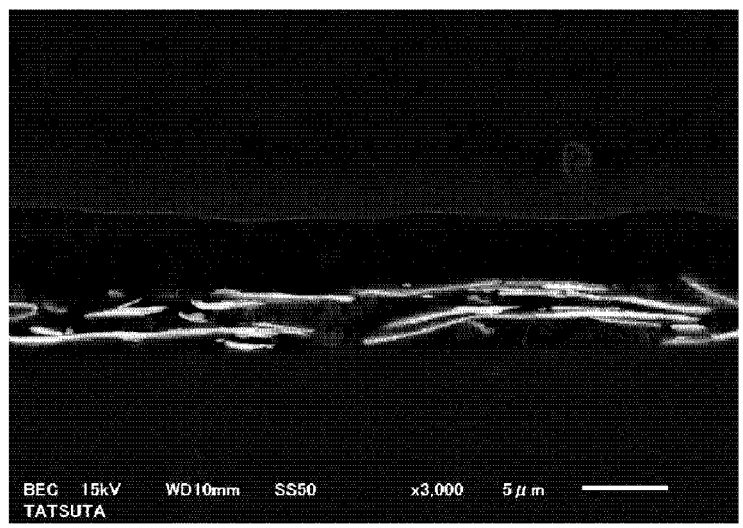
FIG. 4(a) is a cross-sectional SEM image of an electromagnetic wave shielding film according to Example 1.
FIG. 4(b) is a cross-sectional SEM image of an electromagnetic wave shielding film according to Comparative Example 1.
Figure 4:
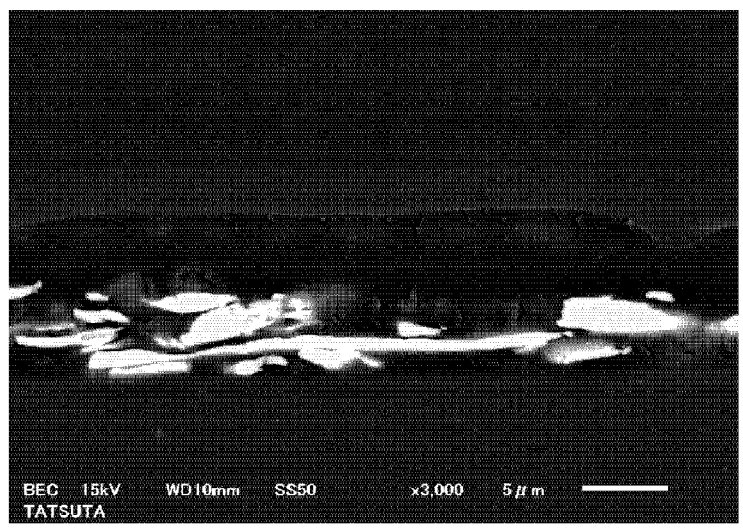

FIG. 4(a) is a cross-sectional SEM image of the electromagnetic wave shielding film according to Example 1.

FIG. 4(b) is a cross-sectional SEM image of the electromagnetic wave shielding film according to Comparative Example 1.

Separately, the electromagnetic wave shielding films according to the examples and the comparative examples were bonded to polyimide resin plates under the same heating and pressurizing conditions described above. Subsequently, the peeling strength of each electromagnetic wave shielding film at peeling from the polyimide resin plate was measured. Table 1 shows the results.

(Connection Resistance Measurement Test)

In each of the electromagnetic wave shielding films according to the examples and the comparative examples, electrodes were connected to a first main surface of the conductive adhesive layer adjacent to the insulating layer and a second main surface opposing the first main surface, and the electrical resistance of the conductive adhesive layer in the thickness direction was measured. The measured electrical resistance was regarded as the initial electrical resistance.

Next, each of the electromagnetic wave shielding films according to the examples and the comparative examples was subjected to hot air reflow five times. Subsequently, in each of the electromagnetic wave shielding films according to the examples and the comparative examples, electrodes were connected to the first main surface of the conductive adhesive layer adjacent to the insulating layer and the second main surface opposing the first main surface, and the electrical resistance of the conductive adhesive layer in the thickness direction was measured. The measured electrical resistance was regarded as the electrical resistance after hot air reflow.

Table 1 shows the initial electrical resistance and the electrical resistance after hot air reflow of each of the electromagnetic wave shielding films according to the examples and the comparative examples.

The hot air reflow simulated the reflow process in the production of electronic devices. The temperature profile was set to expose the electromagnetic wave shielding film to a temperature of 265° C. for five seconds.

(Evaluation of Folding Endurance)

The electromagnetic wave shielding films according to the examples and the comparative examples were evaluated by the following method.

In each of the examples and the comparative examples, the electromagnetic wave shielding films were bonded to both sides of a 50 μm thick polyimide film by hot pressing, and the resulting product was cut to the size of 130 mm (vertical)×15 mm (horizontal) to obtain a test piece. Then, the folding endurance of each test piece was measured using a MIT Folding Endurance Tester (No. 307 MIT Folding Endurance Tester available from Yasuda Seiki Seisakusho Ltd.) by the method specified in JIS P8115:2001.

Test conditions are as follows.
Folding clamp end R: 0.38 mm
Folding angle: ±135°
Folding speed: 175 cpm
Load: 500 gf
Detection method: Breaks are detected by a built-in energizing device.

Folding endurance was evaluated based on the following criteria. Table 1 shows the results.

Excellent: Breaks occurred with the number of folds of 2500 or more.

Good: Breaks occurred with the number of folds of 1500 or more and less than 2500.

Poor: Breaks occurred with the number of folds of less than 1500.

The folding endurance of the electromagnetic wave shielding film according to Comparative Example 2 was not evaluated because no resistance was detected.

(Conformability Test)

Figure 5:
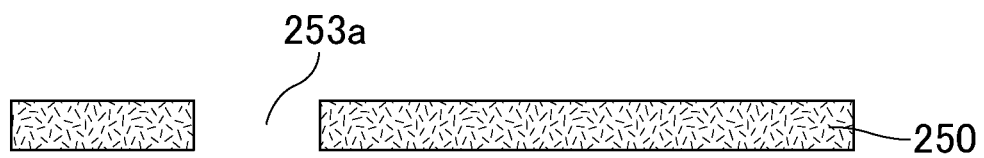
FIGS. 5(a) and 5(b) are schematic views of a conformability test.
Figure 5:
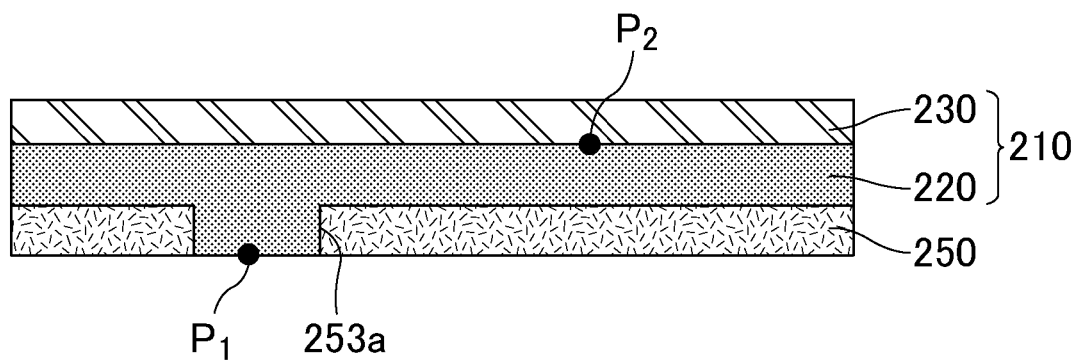

FIGS. 5(a) and 5(b) are schematic views of a conformability test.

As shown in FIG. 5(a), a 100 μm thick polyimide resin plate 250 including a cylindrical through-hole 253a was provided, and an electromagnetic wave shielding film 210 according to Example 2 was arranged such that a conductive adhesive layer 220 was in contact with the polyimide resin plate 250 and covered the through-hole 253a.

Table 2 shows opening diameters of the through-hole 253a.

Next, the electromagnetic wave shielding film according Example 2 was attached to the polyimide resin plate by heating and pressurizing at 150° C. and 2 MPa for 30 minutes.

Thus, as shown in FIG. 5(b), the through-hole 253a was filled with the conductive adhesive layer 220 of the electromagnetic wave shielding film 210.

Next, electrodes were connected to a portion indicated by P1 and a portion indicated by P2 in FIG. 5(b) to measure the electrical resistance, with P1 being a portion of the conductive adhesive layer 220 at the bottom of the through-hole 253a, and P2 being a portion of the conductive adhesive layer 220 adjacent to an insulating layer 230 not covering the through-hole 253a. Table 2 shows the results.

TABLE 2

| | | Example 2 |
|---|---|---|
| Physical properties of conductive particles | Shape | Flaky |
| | Specific surface area (m²/g) | 1.00 |
| | Tap density (g/cm²) | 1.30 |
| | Average length (μm) | 7.55 |
| | Aspect ratio of conductive particles | 26.5 |
| Weight percentage (wt %) of conductive particles | | 65 |
| Area percentage (%) of adhesive resin composition in cut surface of electromagnetic wave shielding film before heating and pressurizing | | 81.1 |
| Area percentage (%) of adhesive resin composition in cut surface of electromagnetic wave shielding film after heating and pressurizing | | 78 |
| Conformability test | Opening diameter 0.5 mm | 101 |
| | Opening diameter 0.8 mm | 74 |
| | Opening diameter 1.0 mm | 60 |
| | Opening diameter 1.4 mm | 44 |
| | Opening diameter 1.8 mm | 38 |

* OL means that the resistance exceeds 3.5 MΩ

As shown in Tables 1 and 2, the electromagnetic wave shielding films according to the examples of the present invention can be made thinner, have a higher peeling strength, and are excellent in conductivity, heat cycle resistance, and conformability.

REFERENCE SIGNS LIST 10, 110, 210 electromagnetic wave shielding film
20, 220 conductive adhesive layer
21 conductive particles
22 adhesive resin composition
30, 230 insulating layer
40 metal film
50 printed wiring board
51 base film
52 printed circuit
52a ground circuit
53 coverlay
53a opening
60 shielded printed wiring board
250 polyimide resin plate
253a through-hole

The invention claimed is:

1. An electromagnetic wave shielding film comprising:
a conductive adhesive layer containing conductive particles and an adhesive resin composition,
wherein in a cut surface of the conductive adhesive layer after heating and pressurizing the electromagnetic wave shielding film at 150° C. and 2 MPa for 30 minutes, the conductive particles have an average aspect ratio of 18 or more, and
an area percentage of the adhesive resin composition is 60 to 95% relative to a total area of the cut surface.

2. The electromagnetic wave shielding film according to claim 1, further comprising an insulating layer.

3. The electromagnetic wave shielding film according to claim 2, further comprising a metal film between the insulating layer and the conductive adhesive layer.

4. The electromagnetic wave shielding film according to claim 1, wherein in the cut surface, the conductive particles have an average length of 5.0 to 50.0 μm.

5. The electromagnetic wave shielding film according to claim 1, wherein a weight percentage of the conductive particles is 60 to 80 wt % relative to a total weight of the conductive particles and the adhesive resin composition.

6. A shielded printed wiring board comprising:
a printed wiring board including a base film, a printed circuit on the base film, and a coverlay covering the printed circuit; and
an electromagnetic wave shielding film including a conductive adhesive layer containing conductive particles and an adhesive resin composition,
the electromagnetic wave shielding film being bonded by thermal compression to the printed wiring board such that the conductive adhesive layer is in contact with the coverlay,
wherein in a cut surface of the conductive adhesive layer after the electromagnetic wave shielding film to be subjected to the thermal compression is heated and pressurized at 150° C. and 2 MPa for 30 minutes, the conductive particles have an average aspect ratio of 18 or more, and
in the cut surface of the conductive adhesive layer, an area percentage of the adhesive resin composition is 60 to 95% relative to a total area of the cut surface.

7. The shielded printed wiring board according to claim 6, wherein the printed circuit comprises a ground circuit,
the coverlay has an opening formed therein for exposing the ground circuit, and
the conductive adhesive layer fills the opening and is in contact with the ground circuit.

8. The shielded printed wiring board according to claim 6, further comprising an insulating layer adjacent to a side of the conductive adhesive layer, the side being not in contact with the coverlay.

9. The shielded printed wiring board according to claim 8, further comprising a metal film between the conductive adhesive layer and the insulating layer.

10. The shielded printed wiring board according to claim 6, wherein the conductive particles have an average length of 5.0 to 50.0 μm.

11. The shielded printed wiring board according to claim 6, wherein the conductive adhesive layer has a thickness of 2 to 7 μm.

12. The shielded printed wiring board according to claim 6, wherein a weight percentage of the conductive particles is 60 to 80 wt % relative to a total weight of the conductive particles and the adhesive resin composition.

* * * * *